United States Patent [19]
Dietl et al.

[11] 4,011,074
[45] Mar. 8, 1977

[54] PROCESS FOR PREPARING A HOMOGENEOUS ALLOY

[75] Inventors: Josef Dietl; Josef Jarosch, both of Munich, Germany

[73] Assignee: Consortium fur Elektrochemische Industrie GmbH, Munich, Germany

[22] Filed: Jan. 26, 1976

[21] Appl. No.: 652,273

Related U.S. Application Data

[63] Continuation-in-part of Ser. No. 454,517, March 25, 1974, abandoned.

[52] U.S. Cl. .............................. 75/135; 75/65 R; 75/134 H; 75/169; 156/617 R; 156/617 H; 252/62.3 R; 252/62.3 ZT
[51] Int. Cl.² ........................................ C22C 1/00
[58] Field of Search ............. 75/134 R, 134 H, 169, 75/65 ZM, 135, 65 R; 252/62.3 R, 62.3 ZT; 156/616, DIG. 72, 617 R, 617 H

[56] References Cited
UNITED STATES PATENTS

| | | | |
|---|---|---|---|
| 3,210,149 | 10/1965 | Eland | 252/62.3 ZT |
| 3,468,363 | 9/1969 | Parker et al. | 75/169 X |
| 3,514,347 | 5/1970 | Fumeron et al. | 75/134 H |
| 3,656,944 | 4/1972 | Brau | 75/169 |
| 3,723,190 | 3/1973 | Kruse et al. | 75/169 |
| 3,771,970 | 11/1973 | Hemmat et al. | 252/62.3 ZT |
| 3,849,205 | 11/1974 | Brau | 75/169 |
| 3,925,108 | 12/1975 | Woodbury | 252/62.3 ZT |

*Primary Examiner*—M. J. Andrews
*Attorney, Agent, or Firm*—Allison C. Collard

[57] ABSTRACT

A process for making a homogeneous solidified alloy having at least one component with a comparatively high vapor pressure, in which the alloy components are enclosed in the form of a homogeneous melt in a sealed ampoule and cooled therein, the volume free of melt in said ampoule being during the entire cooling step of the melt between 0.001 and 1 cc, and the ratio of the volume of the ampoule free of melt and that of the ampoule filled with melt is not larger than 1:5.

4 Claims, 2 Drawing Figures

U.S. Patent     Mar. 8, 1977     4,011,074
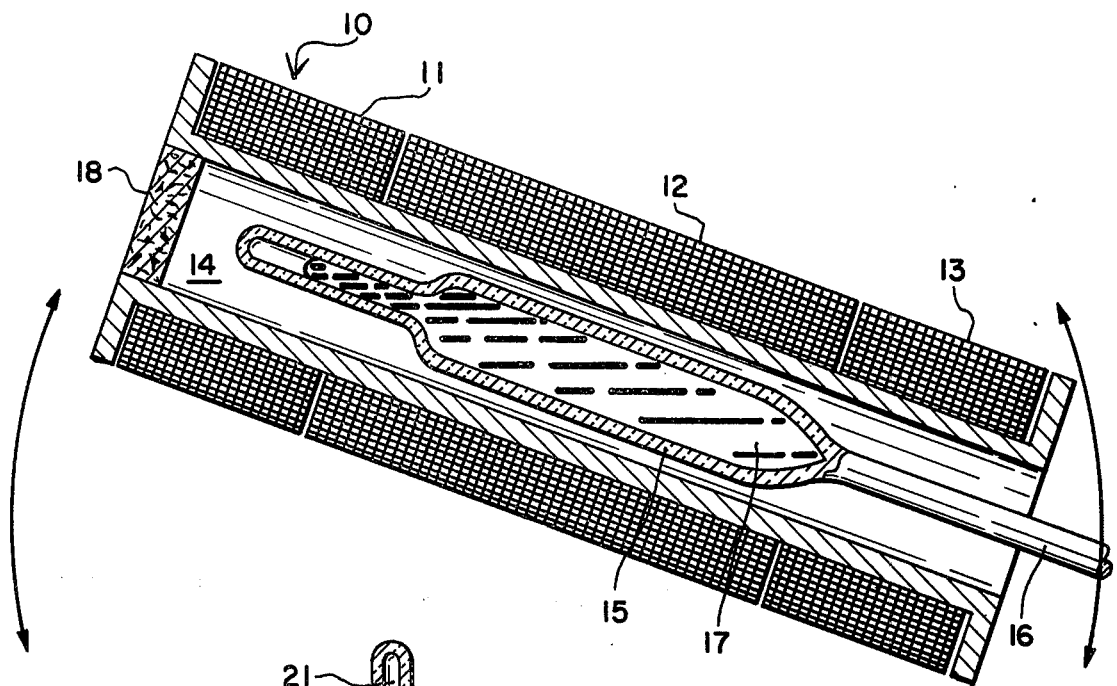
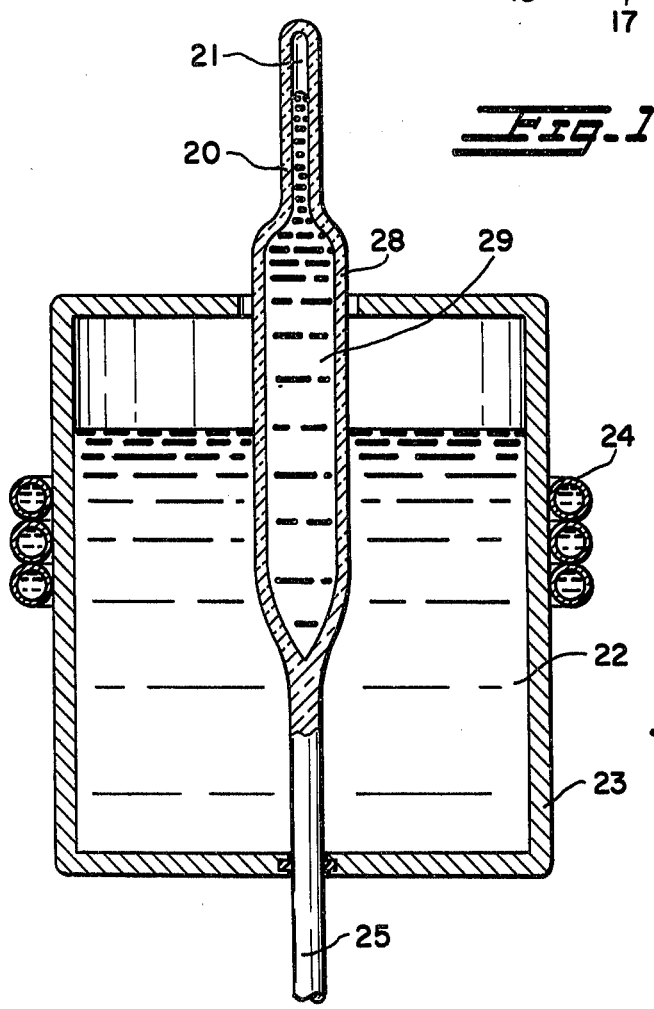
Fig.1.
Fig.2.

PROCESS FOR PREPARING A HOMOGENEOUS ALLOY

This is a continuation-in-part application of patent application Ser. No. 454,517 filed Mar. 25, 1974 now abandoned.

This invention relates to a process for preparing a homogeneous alloy having at least one component which has a comparatively high vapor pressure. Mainly, the invention relates to making crystals which are used as basic elements in electronics. More particularly, it concerns the growing of homogeneous cadmium-mercury-telluride ($Cd_xHg_{1-x}Te$), which is used as an infrared detector.

The band gap of this semiconductor material changes with the amount of cadmium and mercury in the alloy. In accordance therewith, the wave length, at which a detector made of this material operates, may be varied over a wide range by changing the composition. For instance, a detector of $Cd_{0.2}Hg_{0.8}Te$ has its maximum sensitivity in the wave length range of 10 $\mu$m. However, according to known methods, it is extremely difficult to make crystals sufficiently large with the required homogeneity especially for multi-detectors.

There exists, for example, a process for making Cd-Hg-Te crystals by filling the elements in proper ratio into a thick-walled quartz ampoule, subsequently evacuating the same and sealing it. The ampoule is then placed into a conventional rocking furnace and the alloy, which at a temperature of 800° C is in molten condition, is thoroughly mixed by rocking over a considerable period. The melt is finally brought to solidification by lowering it from the furnace at a rate of about 1 mm/hour through a high temperature gradient (Bridgman Method).

At this slow rate of crystal growth, the segregation of the components occurs according to the phase diagram: At the start of the crystallization, a crystal is formed having a high proportion of cadmium telluride, whereas the last part of the solidified crystal exhibits a considerably higher proportion of mercury telluride. In addition to this gradient of concentration in the longitudinal direction of the crystal, there occurs, as known, a radial concentration gradient. In order to obtain a crystal of the desired composition, it is necessary to cut up the alloy made according to the above process by sawing, and to test the pieces to find out their composition. In this manner, only a small piece of homogeneous crystal required for detector use is obtained at any time.

In order to obtain sufficiently large homogeneous crystals, one has to abandon the slow Bridgman growing method and use a very rapid crystallization process, as it may be achieved, e.g., by submersion of the ampoule into a cooling liquid or by cooling it in a cold gas stream. However, the crystals so made have an axial channel of increasing width toward the end of the crystal, the channel being more or less porous or full of holes. The formation of the holes is explained as follows: In the rapid cooling, the comparatively large free gas volume present in the ampoule in all known processes, cools down more rapidly than the melt. As a consequence, the vapor pressure in the ampoule drops and this leads to mercury vapor eruptions from the hot melt in the form of small bubbles which are partly enclosed during crystallization and appear as holes in the crystal. In making detectors, only pore-free material can be used so that the crystals with the holes therein cannot be employed.

In U.S. Pat. No. 3,468,363, a process is described in which the rapid crystallization is brought about by a gas stream directed towards the bottom of the ampoule, whereas the side walls of the ampoule are thermally insulated by quartz wool. Thus, a premature cooling of the vapor space is to be prevented. In U.S. Pat. No. 3,656,944, another process is described in which during the cooling of the alloy, a temperature as high as possible is maintained in the vapor space. This is effected either by thermal insulation or by electric resistance heating enclosing said space.

In both the method of thermal insulation and the additional resistance heating, it is very difficult to control the temperature in the vapor space in a manner to maintain the vapor pressure in the space free of the alloy at the desired level, so as to avoid formation of the holes while the melt solidifies.

It is the object of the present invention to provide a method for preparing a homogeneous alloy which overcomes the shortcoming of the known methods.

It is another object of the present invention to provide a process for preparing a homogeneous alloy having at least one component with a comparatively high vapor pressure.

It is a further object of the present invention to make crystals of homogeneous structure and sufficiently large size to be used as basic elements in electronics as infrared detectors.

Other objects and advantages of the present invention will become apparent from the following description and the accompanying drawing.

The process according to the invention is carried out by subjecting the melt of an alloy having at least one component with a relatively high vapor pressure, to cooling in a closed ampoule in which the volume free of melt is between 0.001 and 1 cc. The ratio of the volume free of melt and that filled with melt being not larger than 1:5. Since in the process according to the invention the volume free of melt is very small when compared with known processes, it does not disturb the solidification of the alloy. It is thus possible to make a homogeneous alloy in a simple manner without resorting to thermal insulation or additional heating of the ampoule space free of the melt, said alloy being homogeneous and free of pores or holes.

It has proved advantageous to provide a volume in the closed ampoule free of the melt which is below 0.05 cc. The cooling of the homogeneous melt of the alloy can be effected by a gas stream directed at least toward the lower portion of the ampoule, but preferably by submerging at least a portion of the closed ampoule into a cooling liquid. As a rule, oil is used as cooling liquid. In carrying out this cooling operation it is advantageous to submerge the closed ampoule into the liquid at a rate of at least 10 mm/hour, preferably at the rate of 1–10 mm/sec.

For carrying out the process according to the invention, a closed ampoule is used consisting of quartz glass having a thickness of 2–3 mm. one end of the ampoule being a capillary tube having an inside diameter of 1–3 mm and a length of 40–80 mm.

The capillary tube may also have a different inside diameter, but should be so designed that after the ampoule is filled, it can be sealed with sufficient accuracy at the spot at which the predetermined volume of the ampoule is adjusted, without the filling mass being excessively heated.

For the process of the invention, all conventional sizes of ampoules used in these alloy producing methods can be used, for instance, ampoules having a capacity of 25 cc in the empty state. However, the volume of empty ampoule to be used in the process according to the invention, including the alloy-free space, must not be smaller than 1 cc. Preferred ampoule sizes are those having a capacity of 5–15 cc in the empty state.

The process according to the invention may be used with special advantage for making homogeneous cadmium-mercury telluride alloys, for instance, $Cd_{0.2}Hg_{0.8}Te$ or $Cd_{0.27}Hg_{0.73}Te$, which when used as detectors have a maximum sensitivity in a wave length range of 10 $\mu$m or 5 $\mu$m respectively. The micro-segregation which occurs with Cd-Hg-Te alloys in any case during crystallization, can be easily countered by the conventional annealing processes.

In the accompanying drawing a device for carrying out the process according to the invention will be illustrated by way of example.

In the drawing:

FIG. 1 shows schematically a conventional embodiment of a rocking furnace in central cross-section; and FIG. 2 is a sectional view of the device according to the invention including an illustration of the cooling step.

Referring first to FIG. 1, a rocking furnace generally designed by 10 is shown equipped with three resistance heaters having heat-adjustable coils 11, 12 and 13. The furnace has a central chamber 14 for receiving a quartz ampoule 15. The three heating coils are separately adjustable to insure that the furnace is evenly heated to a constant temperature over the main part of its length. The upper end of chamber 14 is closed by a densely packed plug 18 or quartz wool in order to prevent convection. The quartz ampoule placed within furnace chamber 14 is guided by a quartz rod 16. The ampoule 15 is almost completely filled with molten alloy 17 which consists of cadmium, mercury and tellurium in the desired ratio. Homogeneity of the molten mixture is obtained by rocking the furnace back and forth over a prolonged time about an axis of rotation in a plane normal to the plane of the drawing. The number of rocking movements is between 200 and 500.

FIG. 2, which is a schematical view of the device for carrying out the process of the invention, shows an ampoule 28 which is almost completely filled with molten alloy 29. The upper portion of the ampoule is made in the form of a capillary 20, whose end 21 encloses a very small volume free of melt, where the vapor pressure adjusts itself in equilibrium above the melt. A rod 25 is attached to the other end of the ampoule for guiding the same. For homogenization of the alloy elements, the ampoule is placed into a rocking furnace (not shown) where it undergoes 200 or more rocking movements.

The ampoule is then taken out of the furnace and transferred to a suitable cooling vessel shown at 23, filled with cooling liquid 22, into which at least part of the ampoule is submerged. Cooling coils 24 are provided through which water flows so as to maintain the vessel and the liquid therein at a low temperature. Oil is used as a cooling liquid as is conventional in metal hardening.

The operation according to the invention will now be more fully set forth in two examples dealing with a cadmium-mercury-telluride alloy:

EXAMPLE 1

In accordance with the desired composition $Cd_{0.2}Hg_{0.8}Te$, 3.2996 g. cadmium, 22.1579 g. mercury and 17,8427 g. tellurium are filled into a quartz ampoule. The dimensions of the ampoule are: length 60 mm, inside diameter 12 mm, wall thickness 2 mm. At one end, there is the quartz rod 25 attached for guiding the ampoule. At the other end, the ampoule merges into a capillary 20 having an inside diameter of 2 mm. The ampoule is evacuated and the alloy elements are filled in either by distillation, or in molten condition through the capillary 20. After charging, the ampoule is evacuated further to a remaining pressure of $3.10^{-3}$ torr and the capillary is sealed by melting in a hydrogen flame, in such a manner that a length of 60 mm results. The total ampoule volume is 5.9 cc. The volume free of melt is thereby adjusted to not more than 0.2 cc during the entire cooling of the melt.

The ampoule is placed into the rocking furnace, and the elements are made to react by slow rise in temperature. When a level of about 810° C is reached, the temperature is maintained constant, and the molten alloy is homogenized by 200 rocking movements of the furnace. Subsequently, the furnace is brought into vertical position, the ampoule is removed from the furnace, and passed into the oil bath for half of its length at a rate of about 5 mm/sec. At the same time, the ampoule is turned around its longitudinal axis at 50 rpm.

The solidified melt is free of pores and holes over its entire length and it is substantially homogeneous, which can be shown by sawing the bar along its longitudinal axis. When the bar is to be used for making detectors, the alloy obtained in the process is annealed according to known methods.

EXAMPLE 2

In accordance with the desired composition $Cd_{0.2}Hg_{0.8}Te$, 7.7378 g. cadmium, 51.9551 g. mercury and 41.8363 g. tellurium are filled into a quartz ampoule. the dimensions of the ampoule are: length 125 mm, inside diameter 12 mm, wall thickness 2 mm. At one end of the ampoule, a quartz rod is attached for guiding the ampoule, at the other end, a capillary having an inside diameter of 3 mm is attached. The ampoule is evacuated and the alloy elements are filled in either by distillation or in molten condition through the capillary. After charging, the ampoule is evacuated further to a remaining pressure of $3.10^{-3}$ torr and the capillary is sealed in a hydrogen flame in such a manner that the length of the capillary will be 100 mm. The total ampoule volume is 13.85 cc. A volume free of melt is thereby adjusted to not more than 0.5 cc during the entire cooling of the melt.

According to the mentioned U.S. Pat. No. 3,656,944, a homogeneous pore-free alloy, in which one of the components has a high vapor pressure, is obtained by thermally insulating or heating the gas space of the ampoule during the quenching step. The ratio of alloy-free and alloy-filled volume is not part of the invention of the above patent. Thus, while both the inventor of U.S. Pat. No. 3,656,944 and the present invention have the same object, to obtain homogeneous, porefree alloys, the means by which these ends are achieved are quite different. The former method requires careful adjustment of the temperature of the gas-filled space of the ampoule and of the melt. To influence the temperature requires difficult manipulation. Contrary thereto, according to the present invention, pore-free alloys can be obtained independently from the temperature and pressure conditions in the ampoule.

While in the above examples the process according to the invention has been illustrated for making of a cadmium-mercury-telluride, it should be understood that the same process would lend itself to making other alloys having at least one component with a relatively high vapor pressure.

What is claimed is:

1. In a process for making a homogeneous solidified alloy having at least one component with a comparatively high vapor pressure, in which the alloy components are enclosed in the form of a homogeneous melt in a sealed ampoule and cooled therein, the improvement that the volume free of melt in said ampoule is during the entire cooling step of the melt between 0.001 and 1 cc, and the ratio of the volume of the ampoule free of melt and that of the ampoule filled with melt is not larger than 1:5.

2. The process according to claim 1, wherein the alloy components are cadmium, mercury and tellurium in the ratio to form a telluride.

3. The process according to claim 1, wherein the total volume of the empty ampoule is from 5 to 15 cc.

4. The process according to claim 1, wherein the cooling of the homogeneous melt is effected by submerging at least a part of the closed ampoule in a cooling liquid at a rate of 10 mm/hour to 10/mm sec.

* * * * *